United States Patent
Maeda

(10) Patent No.: US 8,204,352 B2
(45) Date of Patent: Jun. 19, 2012

(54) OPTICAL APPARATUS, SEALING SUBSTRATE, AND METHOD OF MANUFACTURING OPTICAL APPARATUS

(75) Inventor: Toshihiko Maeda, Kirishima (JP)

(73) Assignee: Kyocera Corporation, Kyoto (JP)

( * ) Notice: Subject to any disclaimer, the term of this patent is extended or adjusted under 35 U.S.C. 154(b) by 247 days.

(21) Appl. No.: 12/745,634

(22) PCT Filed: Dec. 1, 2008

(86) PCT No.: PCT/JP2008/071829
§ 371 (c)(1),
(2), (4) Date: Jun. 1, 2010

(87) PCT Pub. No.: WO2009/069807
PCT Pub. Date: Jun. 4, 2009

(65) Prior Publication Data
US 2010/0310216 A1    Dec. 9, 2010

(30) Foreign Application Priority Data
Nov. 29, 2007 (JP) ................................. 2007-308274

(51) Int. Cl.
*G02B 6/00* (2006.01)

(52) U.S. Cl. ........................................ 385/147
(58) Field of Classification Search .................. None
See application file for complete search history.

(56) References Cited

U.S. PATENT DOCUMENTS

| | | | |
|---|---|---|---|
| 5,506,401 A | 4/1996 | Segawa et al. | 250/208.1 |
| 6,774,481 B2 * | 8/2004 | Ono | 257/704 |
| 7,755,030 B2 * | 7/2010 | Minamio | 250/239 |
| 8,138,588 B2 * | 3/2012 | Haskett | 257/678 |
| 2005/0157374 A1 | 7/2005 | Tarn | 359/291 |

FOREIGN PATENT DOCUMENTS

| | | |
|---|---|---|
| JP | 07-099214 | 4/1995 |
| JP | 2002-141430 | 5/2002 |
| JP | 2007-528591 | 10/2007 |

* cited by examiner

Primary Examiner — Sung Pak
(74) Attorney, Agent, or Firm — DLA Piper LLP (US)

(57) ABSTRACT

An optical apparatus includes an element substrate on whose surface an optical element is provided; a wiring board disposed so as to face the optical element; a sealing member and a conductive member provided between the element substrate and the wiring board. The sealing member surrounds and hermetically seals the optical element. The conductive member electrically connects the optical element and the wiring board. The wiring board has a light-transmitting area transmitting light to the optical element.

9 Claims, 8 Drawing Sheets

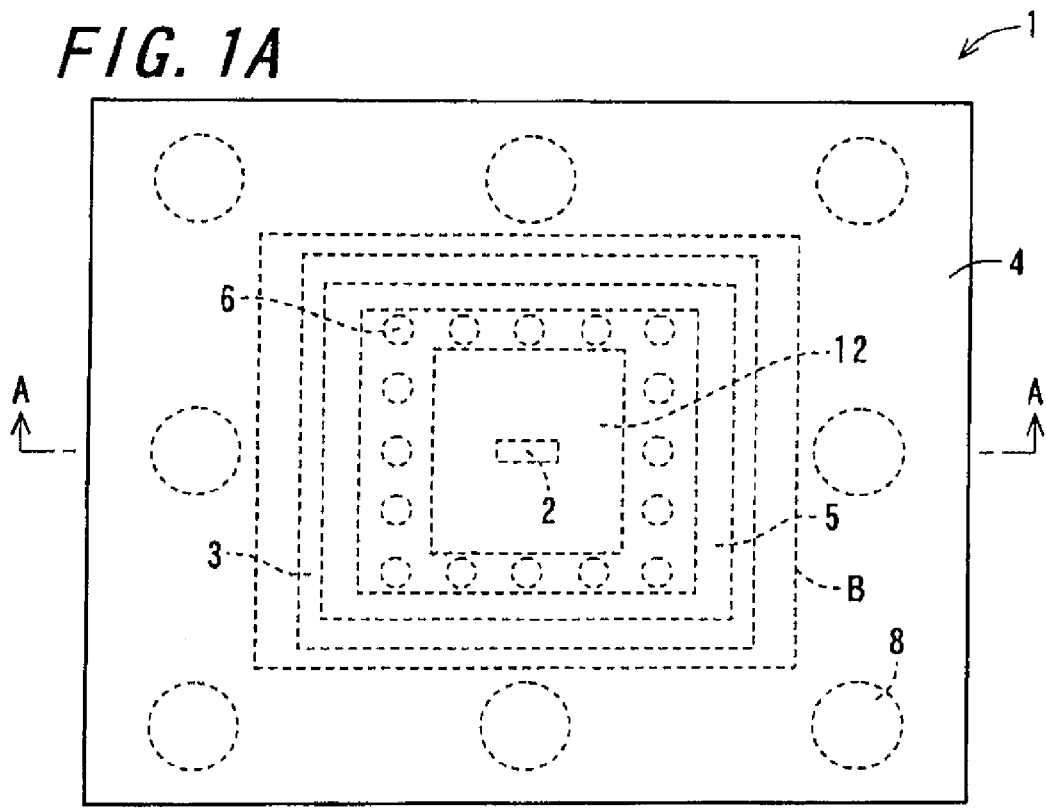
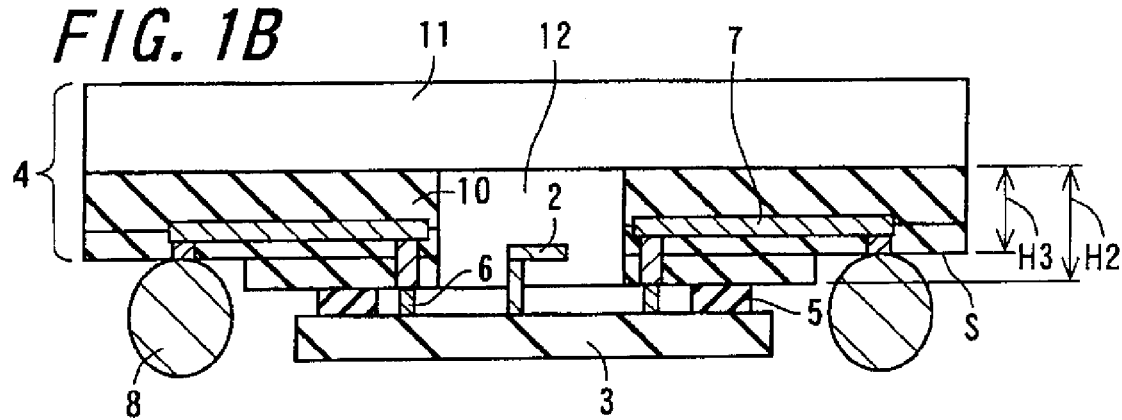

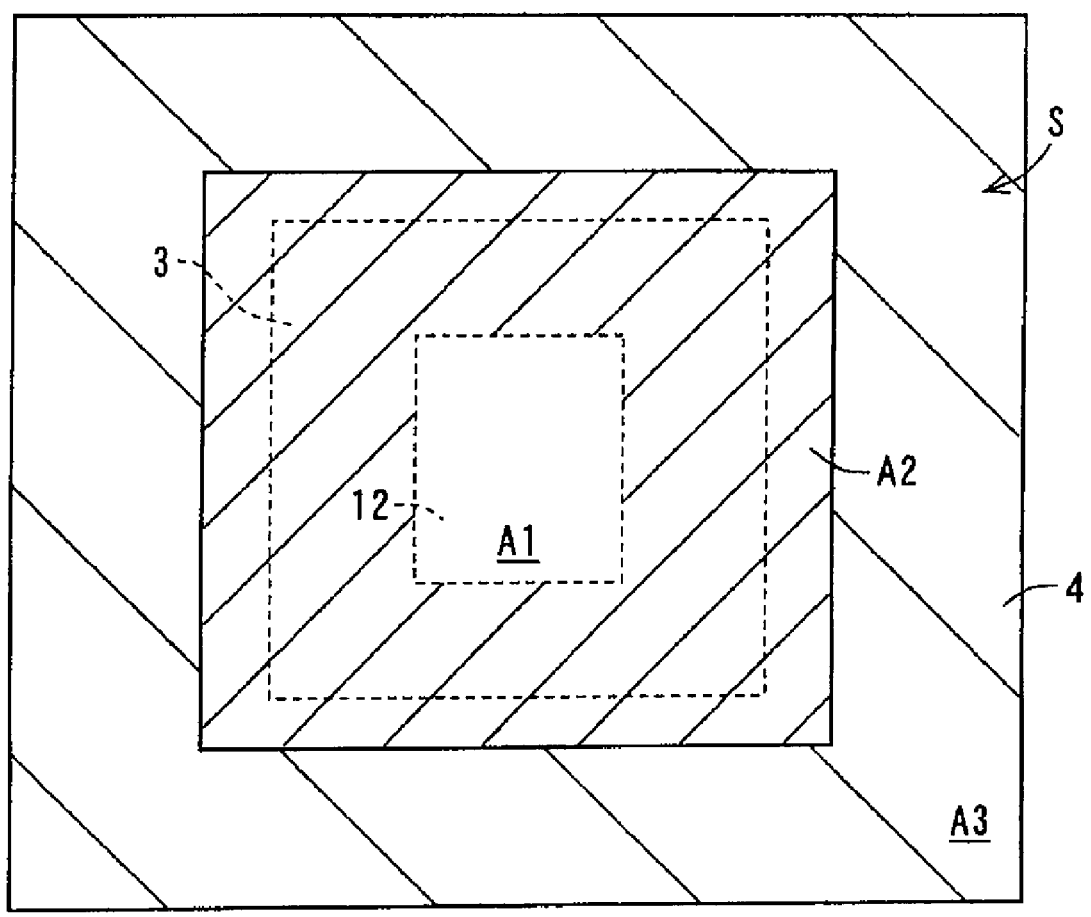

OPTICAL APPARATUS, SEALING SUBSTRATE, AND METHOD OF MANUFACTURING OPTICAL APPARATUS

CROSS-REFERENCE TO THE RELATED APPLICATIONS

This application is a national stage of international application No. PCT/JP2008/071829, filed on Dec. 1, 2008, and claims the benefit of priority under 35 USC 119 to Japanese Patent Application No. 2007-308274, filed on Nov. 29, 2007, the entire contents of which are incorporated herein by reference.

TECHNICAL FIELD

The present invention relates to an optical apparatus, a sealing substrate for an optical element used in the optical apparatus, and a method of manufacturing the optical apparatus.

BACKGROUND ART

Recently, an electronic apparatus has been attracting attention and has been developed for practical use, in which a microelectromechanical system (hereinafter, referred to as a "MEMS") is formed on a main face of a semiconductor substrate by the application of processing techniques for forming fine wiring of an integrated circuit element or the like. Examples of this sort of electronic apparatus include an optical switch that switches optical paths by driving a micromirror. A MEMS used in the field of optics, such as this micromirror, is particularly referred to as an optical MEMS.

As a method for packaging this sort of optical MEMS, there is a method for bonding a support substrate that has an optical MEMS formed thereon and a cover substrate that covers the optical MEMS via a sealing medium (see Japanese Unexamined Patent Publication JP-A 2007-528591, for example). In this case, light has to be transmitted to the optical MEMS, and, thus, for example, glass having a light-transmitting property is used as the cover substrate.

Meanwhile, electric connection may be necessary between the optical MEMS and an external circuit. However, in the case where glass is used as the cover substrate, it is difficult to form a wiring conductor having a complicated shape in the glass, and, thus, it is difficult to realize electric connection having a high degree of freedom between the optical MEMS and the external circuit.

As described above, an optical apparatus obtained by packaging an optical MEMS is required to have a light-transmitting property to the optical MEMS, and establish electric connection having a high degree of freedom between the optical MEMS and an external circuit.

DISCLOSURE OF INVENTION

According to an aspect of the invention, an optical apparatus comprises an element substrate on whose surface an optical element is provided; a wiring board disposed so as to face the optical element; a sealing member and a conductive member provided between the element substrate and the wiring board. The sealing member surrounds and hermetically seals the optical element. The conductive member electrically connects the optical element and the wiring board. The wiring board comprises a light-transmitting area transmitting light toward the optical element.

According to an aspect of the invention, a sealing substrate is a substrate for hermetically sealing an optical element of an element substrate on whose surface the optical element is provided. The sealing substrate comprises a wiring board disposed so as to face the optical element; a sealing member provided on the wiring board, and surrounding and hermetically sealing the optical element between the element substrate and the wiring board; and a conductive member provided on the wiring board, electrically connecting the optical element and the wiring board. The wiring board has a light-transmitting area transmitting light toward the optical element.

According to an aspect of the invention, a method of manufacturing an optical apparatus comprises a step of preparing a plurality of glass-ceramic green sheets; a step of forming a hole portion through the plurality of glass-ceramic green sheets; a step of forming a conductor portion configured to be a wiring conductor after firing, in at least one of the glass-ceramic green sheets; a step of laminating the plurality of glass-ceramic green sheets, and forming a green sheet laminate comprising a through-hole; a step of laminating the green sheet laminate on a glass substrate, and subjecting the glass substrate and the green sheet laminate to thermocompression bonding; a step of firing the green sheet laminate to form a composite substrate; a step of preparing an element substrate on which an optical element is provided; and a step of connecting the element substrate and the composite substrate in a state that the optical element and the through-hole of the composite substrate face each other.

In accordance with the aspect of the invention, the optical apparatus can have a light-transmitting property to an optical MEMS, and can realize electric connection having a high degree of freedom between the optical MEMS and an external circuit.

In accordance with the aspect of the invention, the sealing substrate can realize an optical apparatus that has a light-transmitting property to an optical MEMS, and that establish electric connection having a high degree of freedom between the optical MEMS and an external circuit.

In accordance with the aspect of the invention, it is possible to manufacture an optical apparatus that has a light-transmitting property to an optical MEMS, and that establish electric connection having a high degree of freedom between the optical MEMS and an external circuit.

BRIEF DESCRIPTION OF DRAWINGS

Other and further objects, features, and advantages of the invention will be more explicit from the following detailed description taken with reference to the drawings wherein:

FIG. 1A is a plan view showing a configuration example of an optical apparatus according to an embodiment of the invention in a see-through manner;

FIG. 1B is a cross-sectional view taken along line A-A in FIG. 1A;

FIG. 2 is a view showing areas A1 to A3 on a surface S of a wiring board;

BEST MODE FOR CARRYING OUT THE INVENTION

Figure 3A:
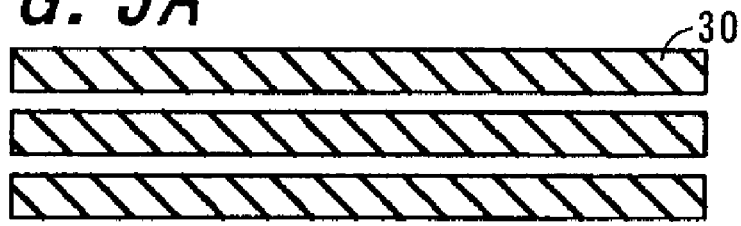
FIG. 3A is a view illustrating a method of manufacturing the optical apparatus of FIG. 1.

Now referring to the drawings, preferred embodiments of the invention are described below.

As shown in FIGS. 1A and 1B, an optical apparatus 1 according to an embodiment of the invention has an element substrate 3 on whose surface an optical MEMS 2 is provided, a wiring board 4 disposed so as to face the optical MEMS 2, and a sealing member 5 and conductive members 6 arranged between the element substrate 3 and the wiring board 4. The element substrate 3 is, for example, a semiconductor substrate, and the optical MEMS 2 is formed on a surface thereof using a micromachining technique. The sealing member 5 connects the element substrate 3 and the wiring board 4, and surrounds and hermetically seals the optical MEMS 2. The conductive members 6 electrically connect the optical MEMS 2 and the wiring board 4. For example, an electrode electrically connected to the optical MEMS 2 is disposed on a surface of the element substrate 3. In this case, the conductive members 6 connect this electrode and a wiring conductor 7 provided in the wiring board 4.

Here, in FIGS. 1A and 1B, the conductive members 6 are arranged inside the sealing member 5, but may be arranged outside the sealing member 5. In the case where the conductive members 6 are arranged outside the sealing member 5, electromagnetic interference between the optical MEMS 2 and the conductive members 6 can be further suppressed. Furthermore, a bonding portion between the conductive members 6 and the element substrate 3 and a bonding portion between the conductive members 6 and the wiring board 4 can be easily observed after the optical MEMS 2 is hermetically sealed, and, thus, an optical apparatus 1 having a high reliability in electrical bonding between the element substrate 3 and the wiring board 4 can be realized. In the case where the conductive members 6 are arranged inside the sealing member 5, the conductive members 6 are hermetically sealed, deterioration due to impurities in air can be suppressed, and, thus, the reliability in electrical connection is even higher.

Furthermore, the optical apparatus 1 has external connection terminals 8 located in a peripheral portion of a surface S of the wiring board 4 facing the element substrate 3. In this example, the surface S is a surface on which the sealing member 5 and the conductive members 6 are provided. The external connection terminals 8 are connected to the wiring conductor 7. The external connection terminals 8 electrically connect the wiring board 4 and an external circuit board, such as a printed wiring board. The external connection terminals 8 are arranged around the sealing member 5 and the conductive members 6 on the surface S. Here, when the optical apparatus 1 is seen through from above, as indicated by the broken line in FIG. 1A, the element substrate 3 is positioned inside the wiring board 4. In this case, the external connection terminals 8 are positioned around the element substrate 3. The lower ends of the external connection terminals 8 have to be connected to an external circuit board and thus are positioned below the element substrate 3. Here, as described later, the broken line B in FIG. 1A indicates a boundary between an area A2 that includes the sealing member 5 and an area A3 that includes the external connection terminals 8.

In the wiring board 4, an insulating substrate 10 that contains the wiring conductor 7 and a light-transmitting substrate 11 that transmits desired light are bonded to each other. Here, the light-transmitting substrate 11 is a glass substrate. As shown in FIG. 1B, the glass substrate 11 is laminated on the insulating substrate 10. The insulating substrate 10 is, for example, a laminate in which a plurality of insulating layers made of glass ceramics are laminated one on top of another.

The insulating substrate 10 faces the element substrate 3. The insulating substrate 10 has a through-hole 12 in an area that faces the optical MEMS 2. The optical MEMS 2 can receive light that has been transmitted through the glass substrate 11 and has passed through the through-hole 12. For example, in the case where the optical MEMS 2 is a so-called DMD (digital micromirror device), light that has transmitted through the glass substrate 11 is scanned by the optical MEMS 2.

The surface S of the wiring board 4 is stepped. That is to say, as shown in FIG. 2, the surface S has a plurality of areas A1 to A3 with different distances from the glass substrate 11. For example, in the first area A1 that faces the optical MEMS 2, a distance H1 from the glass substrate 11 is 0. In the second area A2 that is positioned around the first area A1, a distance H2 from the glass substrate 11 is longer than the distance H1. This second area A2 includes the sealing member 5 and the conductive members 6. Furthermore, in the third area A3 that is positioned around the second area A2 and that includes the external connection terminals 8, a distance H3 from the glass substrate 11 is shorter than the distance H2. In the case where the distance H3 is shorter than the distance H2 in this manner, projection of the external connection terminals 8 outside of the optical apparatus 1 can be suppressed. As a result, the size of the optical apparatus 1 can be reduced.

In the case where the insulating substrate 10 is made of glass ceramics, the insulating substrate 10 and the glass substrate 11 may be integrated by sintering. More specifically, the insulating substrate 10 may be bonded to the glass substrate 11, by bringing a glass-ceramic green sheet into close contact with the glass substrate 11 by thermocompression bonding, and sintering the glass-ceramic green sheet so as to be integrated with the glass substrate 11.

Here, the glass-ceramic green sheet is obtained by forming a raw powder for the insulating substrate 10, such as a glass powder, a ceramic powder, or the like, into a sheet. At that time, the insulating substrate 10 is bonded to the glass substrate 11, due to a glass component in the insulating substrate 10.

In the case where a flexible glass-ceramic green sheet is brought into close contact with the glass substrate 11 by thermocompression bonding in this manner, the glass substrate 11 and the insulating substrate 10 can be brought into closer contact with each other, and the airtightness of the optical apparatus 1 can be improved.

Here, the glass substrate 11 is required not to be melted and softened at a sintering temperature (800 to 950° C.) of the insulating substrate 10, and not to be opacified by internally precipitating crystals, in order to function as an optical path. Accordingly, the glass substrate 11 is preferably made of silica glass or glass derived therefrom. In particular, silica glass is more preferable because this material has a coefficient of thermal expansion close to that of a semiconductor substrate, has heat resistance to the firing temperature of glass ceramics, and is hard to be opacified by crystallization of glass.

Furthermore, it is desirable that the thickness of the glass substrate 11, in this example, the thickness of the glass substrate 11 in the laminating direction of the glass substrate 11 and the insulating substrate 10 is 0.1 to 0.5 mm. In the case where the thickness of the glass substrate 11 is 0.1 mm or more, the strength of the glass substrate 11 can be assured, and breakage of the glass substrate 11 during thermocompression bonding of the glass-ceramic green sheet and the glass substrate 11 can be suppressed. Furthermore, in the case where the thickness of the glass substrate 11 is 0.5 mm or less, a loss of transmitted light due to the glass substrate 11 can be suppressed, and, thus, the properties of the optical MEMS 2 can be improved.

Furthermore, as described above, in the case where the insulating substrate 10 is a multi-layered substrate, the degree of freedom in arrangement of the wiring conductor 7 in the insulating substrate 10 is increased, and the degree of freedom in electric connection between the wiring board 4 and the element substrate 3, and between the wiring board 4 and an external circuit board can be increased.

Here, the wiring conductor 7 may be formed by co-firing with a glass-ceramic green sheet forming the insulating substrate 10. For example, a hole is formed through a glass-ceramic green sheet using punching, laser beam machining or other methods, and, then, is filled with a conductor paste obtained by forming a metal powder of Ag, Cu, or the like into a paste. Subsequently, the conductor paste is applied to the glass-ceramic green sheet by screen printing or other methods. Then, a plurality of such ceramic green sheets having a surface, and a hole to which the conductor paste is applied are laminated and fired, and, thus, a multi-layered wiring structure can be formed.

In the case where the wiring conductor 7 is formed in the ceramic substrate by co-firing in this manner, the wiring conductor 7 is brought into close contact with the insulating substrate 10 in a preferable manner. Accordingly, formation of a gap between the wiring conductor 7 and the insulating substrate 10 can be suppressed, and, thus, the airtight reliability of the optical apparatus 1 can be increased.

Furthermore, the wiring conductor 7 formed by co-firing as described above can be formed to a thickness of approximately 10 to 30 μm, and, thus, the resistance of the wiring conductor 7 can be reduced.

Furthermore, also in the case where a wiring layer is formed on the surface of the glass substrate 11, the wiring layer of the glass substrate 11 and the wiring conductor 7 can be bonded to each other to obtain conduction, by firing the wiring layer of the glass substrate 11 and the conductor paste of the insulating substrate 10 in a contact state. Accordingly, the wiring conductor 7 inside the insulating substrate 10 and the wiring layer on the glass substrate 11 can be electrically connected to each other, and, thus, the degree of freedom in electric connection can be increased. In this case, the external connection terminals 8 can be arranged on the surface of the glass substrate 11 without being connected to the surface S.

The wiring conductor 7 is formed, for example, by sintering a metal powder of Ag, Cu, or Au, or an alloy thereof.

It is desirable that the insulating substrate 10 is made of a crystallized material having a coefficient of thermal expansion close to that of the glass substrate 11. For example, in the case where the glass substrate 11 is made of silica glass, it is desirable that the insulating substrate 10 has a coefficient of thermal expansion of 1.5 to $3.0 \times 10^{-6}$/° C., which is close to the coefficient of thermal expansion of silica glass, and a degree of crystallization of 70% or more.

In the case where the degree of crystallization of the insulating substrate 10 is 70% or more, the glass-ceramic sintered compact is hard to be damaged in a step of washing the glass substrate 11, and, thus, shedding of particles from the glass-ceramic sintered compact can be reduced.

The insulating substrate 10 having a low coefficient of thermal expansion and a high degree of crystallization can be made of a glass material in which cordierite, β-quartz, β-spodumene, or β-eucryptite is precipitated in the crystal phase, and the crystals or a solid solution thereof can be added to this crystal layer as fillers in order to adjust the coefficient of thermal expansion.

The wiring conductor 7 is disposed in at least one of the internal portion and the surface portion of the insulating substrate 10. In the case where the wiring conductor 7 has a multi-layered wiring structure, the degree of freedom in design of the optical apparatus 1 can be increased.

Furthermore, the semiconductor substrate 3 functions as a spacer during secondary mounting. With this spacer, the height of the external connection terminals 8 can be maintained. Thus, even in the case where the wiring board 4 and an external circuit board have mutually different coefficients of thermal expansion, the reliability of the optical apparatus 1 mounted on an external circuit board can be improved.

The conductive members 6 can be made of, for example, a metal material, such as Au, Ag, Cu, Ni, or the like, or an alloy material thereof. For example, in the case where the conductive members 6 are made of Au bumps, the conductive members 6 may be formed by Au stud bumping.

Furthermore, the external connection terminals 8 are ordinarily made of a solder material, such as Pb—Sn, SnAg, SnAgCu, or the like. Here, it is desirable that the external connection terminals 8 are made of, for example, SnAgCu solder internally containing metal balls, in order to relax a thermal stress between the optical apparatus 1 and the external circuit board.

The sealing member 5 is made of a material that has heat resistance during secondary mounting of the optical apparatus 1. It is desirable that this sort of sealing member 5 is made of, for example, Pb—Sn, AuSn, or fritted glass, in particular, AuSn or fritted glass material. These materials melt and flow at 300 to 450° C., and, thus, a sealing member 5 having smaller gaps and a small void ratio can be formed.

Hereinafter, a method of manufacturing the optical apparatus 1 will be described. First, as shown in FIG. 3A, a plurality of glass-ceramic green sheets 30 are prepared. Here, the glass-ceramic green sheets are obtained as follows: a glass powder, a ceramic powder, an organic binder, an organic solvent, a plasticizer, and the like are combined and mixed to form a slurry, and this slurry is formed into sheets using the doctor blade method or the calendar roll method.

The ceramic powder is, for example, crystals of cordierite, β-quartz, β-spodumene, β-eucryptite, or the like, or a solid solution powder thereof. The glass powder is, for example, an $SiO_2$—$B_2O_3$-based powder, an $SiO_2$—$B_2O_3$—$Al_2O_3$-based powder, or an $SiO_2$—$B_2O_3$—$Al_2O_3$—MgO-based powder. Examples of a combination of the ceramic powder and the glass powder include a combination in which the ceramic powder is cordierite and the glass powder is crystallized glass in which 70% or more of the cordierite is precipitated. In the case where these materials are selected, the obtained glass-ceramic sintered compact has a coefficient of thermal expansion of 2.0 to $3.0 \times 10^{-6}$/° C., and a degree of crystallization of 70% to 80% or more, and, thus, this combination is more preferable.

As the organic binder, those conventionally used for ceramic green sheets can be used, and examples thereof include acrylic-based, polyvinyl butyral-based, polyvinyl alcohol-based, polypropylene carbonate-based, and cellulose-based homopolymers and copolymers.

The organic solvent used in the slurry for forming the green sheets is made of, for example, hydrocarbons, ethers, esters, ketones, alcohols, or the like, in order to obtain a slurry having an appropriate viscosity for forming green sheets by kneading the organic solvent, the glass powder, the ceramic powder, and the organic binder.

Figure 3B:
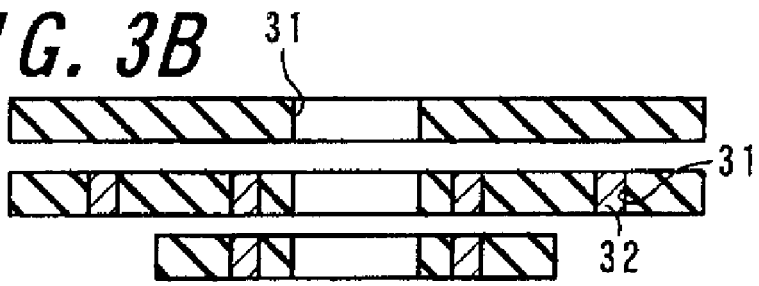
FIG. 3B is a view illustrating a method of manufacturing the optical apparatus of FIG. 1.

Next, as shown in FIG. 3B, the glass-ceramic green sheets 30 produced in FIG. 3A are subjected to mechanical processing, such as die machining, laser beam machining, microdrilling, punching, or the like, and, thus, through-holes 31 are formed. These through-holes 31 are used as through-holes for vias, or used for forming the through-hole 12 that accommodates the optical MEMS 2. Next, the through-holes for vias are filled with a conductor paste 32 in which an appropriate organic binder and solvent are added to and mixed with a metal powder of, for example, Ag, Cu, Ag—Pt, Ag—Pd, or the like, and a glass powder, using screen printing or other methods.

Figure 3C:
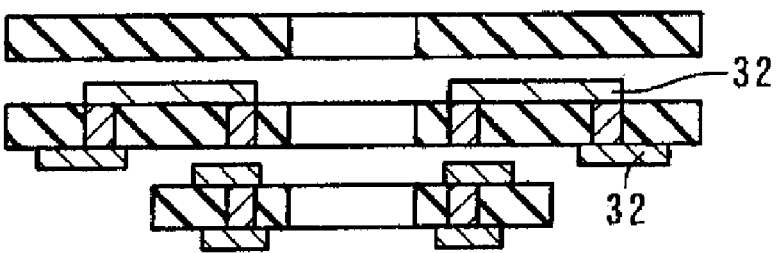
FIG. 3C is a view illustrating a method of manufacturing the optical apparatus of FIG. 1.

Next, as shown in FIG. 3C, the conductor paste 32 is applied to the surfaces of the glass-ceramic green sheets 30 by screen printing or the like.

Figure 3D:
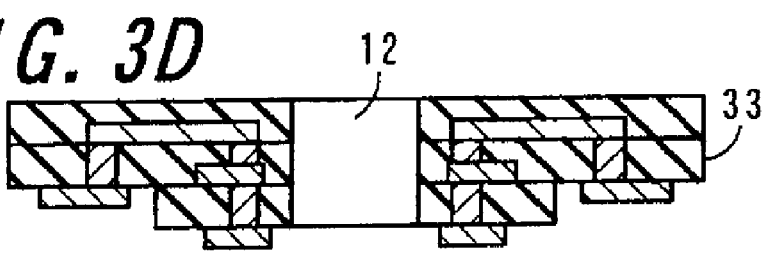
FIG. 3D is a view illustrating a method of manufacturing the optical apparatus of FIG. 1.

Next, as shown in FIG. 3D, the glass-ceramic green sheets 30 to which the conductor paste 32 has been applied are subjected to thermocompression bonding under a pressure of 3 to 20 MPa and a temperature of 50 to 80° C., and, thus, a green sheet laminate 33 is formed. At that time, it is desirable that a glass-ceramic green sheet 30 disposed as an uppermost layer of the green sheet laminate 33 contains a melting component that melts due to heat applied for close contact.

Figure 3E:
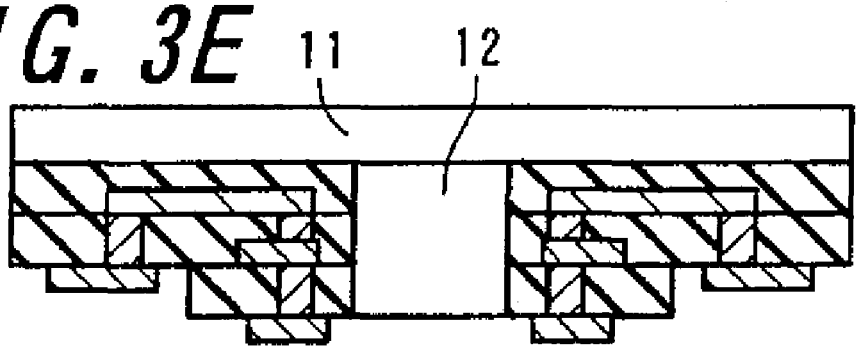
FIG. 3E is a view illustrating a method of manufacturing the optical apparatus of FIG. 1.

Next, as shown in FIG. 3E, the glass substrate 11 and the green sheet laminate 33 are subjected to thermocompression bonding under a pressure of 3 to 10 MPa and a temperature of 50 to 80° C., and, thus, the glass substrate 11 and the green sheet laminate 33 are thermocompression bonded to each other.

Here, it is preferable that an outermost layer of the green sheet laminate 33, that is, a glass-ceramic green sheet 30 brought into contact with the glass substrate 11 contains a melting component that melts due to heat applied for close contact. In this case, the glass substrate 11 and the green sheet laminate 33 can be brought into close contact with each other under a lower pressure, and, thus, the possibility of breaking the glass substrate 11 can be reduced in the step of FIG. 3E.

Figure 3F:
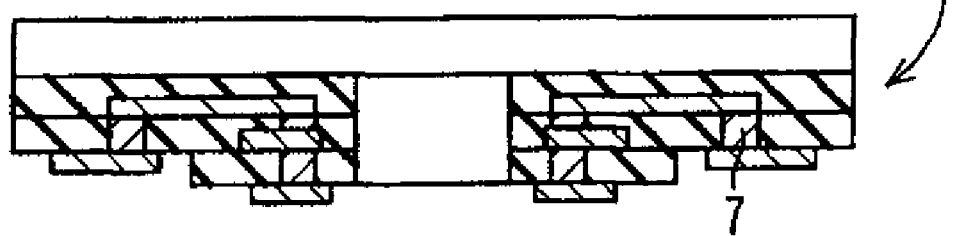
FIG. 3F is a view illustrating a method of manufacturing the optical apparatus of FIG. 1.

Next, as shown in FIG. 3F, the green sheet laminate 33 that has been thermocompression bonded to the glass substrate 11 is fired, and, thus, a composite substrate 34 (the wiring board 4) is formed. Here, in the case where the wiring conductor 7 is made of a sintered compact of, for example, an Ag, Ag—Pt, or Ag—Pd metal powder, the firing is performed in air at a temperature of 800 to 1000° C. Furthermore, in the case where the wiring conductor 7 is made of a sintered compact of a Cu metal powder, the firing is performed in a nitrogen atmosphere.

At that time, the contraction of the green sheet laminate 33 in the main face direction is suppressed by the glass substrate 11, and, thus, the green sheet laminate 33 is contracted in the Z direction, and the precision of the size in the main face direction can be kept high. Accordingly, a composite substrate 34 can be obtained in which positional displacement can be reduced between an electrode on the element substrate 3 and a conductive pad, which is part of the wiring conductor 7 formed in the green sheet laminate 33.

Figure 4A:
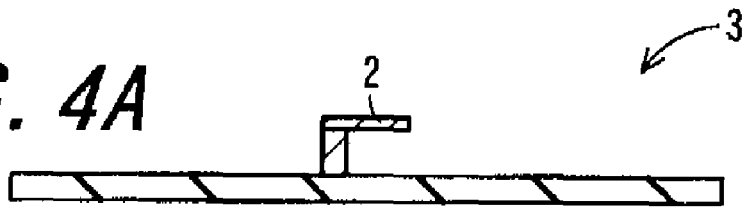
FIG. 4A is a view illustrating a method of manufacturing the optical apparatus of FIG. 1.

Next, as shown in FIG. 4A, a semiconductor substrate 3 is prepared. The semiconductor substrate 3 is made of single crystal or multicrystal silicon. The optical MEMS 2 is formed on the surface of the semiconductor substrate 3 using a micromachining technique.

Figure 4B:
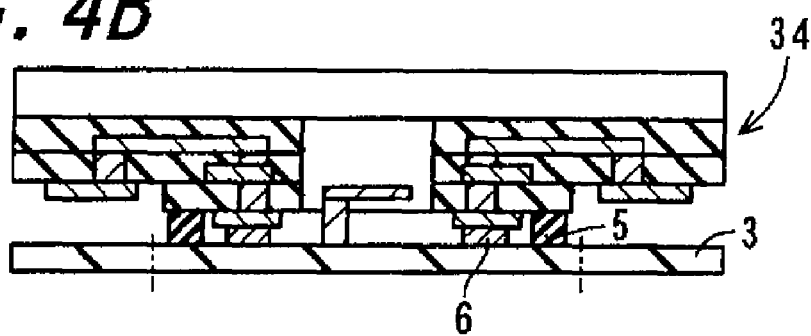
FIG. 4B is a view illustrating a method of manufacturing the optical apparatus of FIG. 1.

Next, as shown in FIG. 4B, the semiconductor substrate 3 and the composite substrate 34 are connected to each other via the sealing member 5 and the conductive members 6 such that the optical MEMS 2 and the through-hole 12 of the composite substrate 34 face each other. At that time, the sealing member 5 and the conductive members 6 may be bonded in advance to a surface of either the semiconductor substrate 3 or the composite substrate 34. At that time, the semiconductor substrate 3 and the composite substrate 34 are connected to each other under the condition of a temperature of 300 to 450° C. and a pressure of several megapascals (MPa) to several tens of megapascals (MPa). Here, the temperature applied during the connection is a temperature higher than the melting points of the sealing material forming the sealing member 5, and the conductive members. Furthermore, when the semiconductor substrate 3 and the composite substrate 34 are connected to each other, a pressure is applied in order to correct warping of the semiconductor substrate 3 and the composite substrate 34.

Here, it is desirable that the conductive members 6 are made of Au bumps, and that the sealing material forming the sealing member 5 is made of AuSn solder or fritted glass. The Au bumps can be formed using a known stud bump method with Au wires, and the sealing member 5 can be formed by applying a paste using a screen printing method and causing the paste to melt them by reflow processing or the like. With the Au bumps, the distance can be easily controlled between the semiconductor substrate 3 and the composite substrate 34. Furthermore, the sealing material made of AuSn solder or fritted glass forms a liquid phase, and can flow to fill small gaps, and, thus, a sealing member 5 having a high reliability can be formed.

Then, after the semiconductor substrate 3 and the composite substrate 34 are connected to each other, the semiconductor substrate 3 is cut at a position indicated by the broken lines in FIG. 4B, and a peripheral portion of the semiconductor substrate 3 is removed.

Figure 4C:
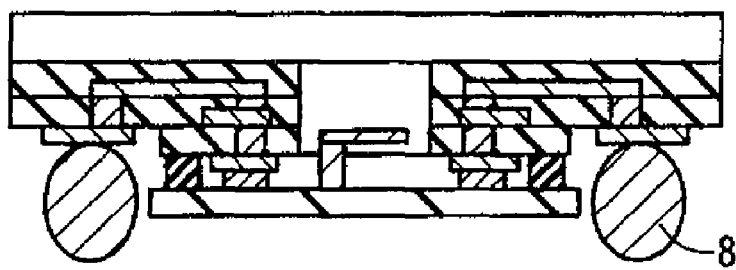
FIG. 4C is a view illustrating a method of manufacturing the optical apparatus of FIG. 1.

Next, as shown in FIG. 4C, solder balls are attached as the external connection terminals 8 to a peripheral portion of the surface of the wiring board 4, using appropriate jigs and tools.

The optical apparatus 1 according to this embodiment can sufficiently transmit light to the optical MEMS, and can secure electric connection having a high reliability between the optical MEMS and an external circuit. Furthermore, in the optical apparatus 1, the insulating substrate 10 made of glass ceramics and the semiconductor substrate 3 are connected to each other via the sealing member 5, and, thus, the optical MEMS 2 can be hermetically sealed. In particular, since the glass substrate 11 and the insulating substrate 10 are integrated by sintering, and, thus, close contact between the insulating substrate 10 and the glass substrate 11 can be maintained in a preferable manner, and the airtightness of the optical MEMS 2 can be improved.

Next, a method of manufacturing the optical apparatus 1 will be described in the case where a plurality of optical apparatuses 1 are formed on one substrate, and individual optical apparatuses 1 are obtained by cutting this substrate. FIGS. 5A to 6C correspond to FIGS. 3A to 4C, and the same configurations are denoted by the same reference numerals. In this example, only main points of difference from FIGS. 3A to 4C will be described. That is to say, description of configurations as in FIGS. 3A to 4C may be omitted.

Figure 5A:
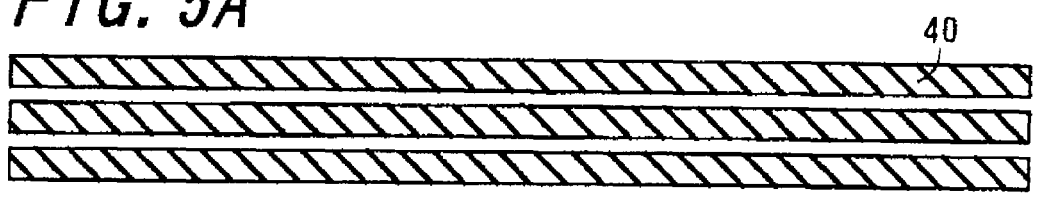
FIG. 5A is a view illustrating another method of manufacturing the optical apparatus of FIG. 1.

First, as shown in FIG. 5A, glass-ceramic green sheets 40 are prepared.

Figure 5B:
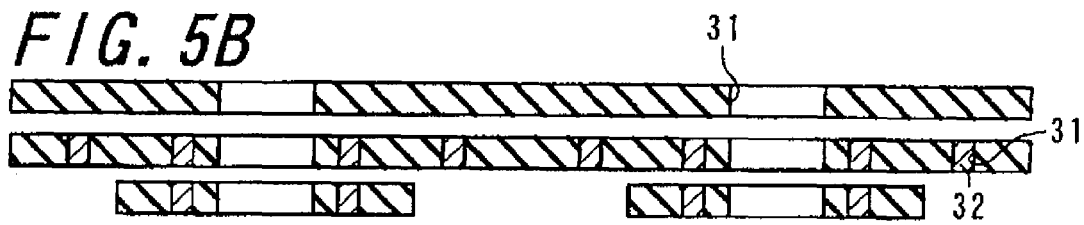
FIG. 5B is a view illustrating the other method of manufacturing the optical apparatus of FIG. 1.

Next, as shown in FIG. 5B, through-holes 31 used as through-holes for vias, or used for forming the through-holes 12 that accommodate the optical MEMSs 2 are formed through the glass-ceramic green sheets 40 formed in FIG. 5A. Then, the through-holes for vias are filled with a conductor paste 32 using screen printing or other methods.

Figure 5C:
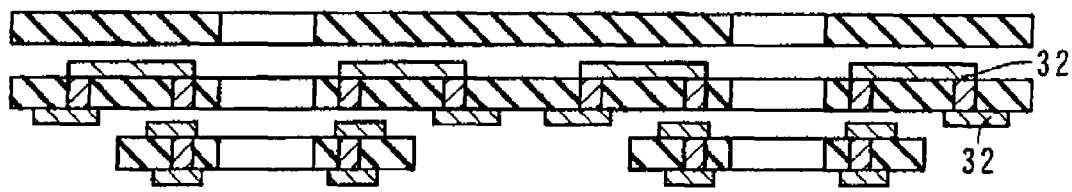
FIG. 5C is a view illustrating the other method of manufacturing the optical apparatus of FIG. 1.

Next, as shown in FIG. 5C, the conductor paste 32 is applied to the surfaces of the glass-ceramic green sheets 40.

Figure 5D:
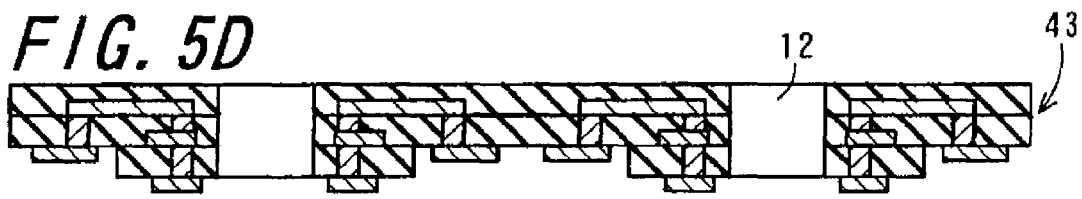
FIG. 5D is a view illustrating the other method of manufacturing the optical apparatus of FIG. 1.

Next, as shown in FIG. 5D, the glass-ceramic green sheets 40 to which the conductor paste 32 has been applied are subjected to thermocompression bonding under a pressure of 3 to 20 MPa and a temperature of 50 to 80° C., and, thus, a green sheet laminate 43 is formed.

Figure 5E:
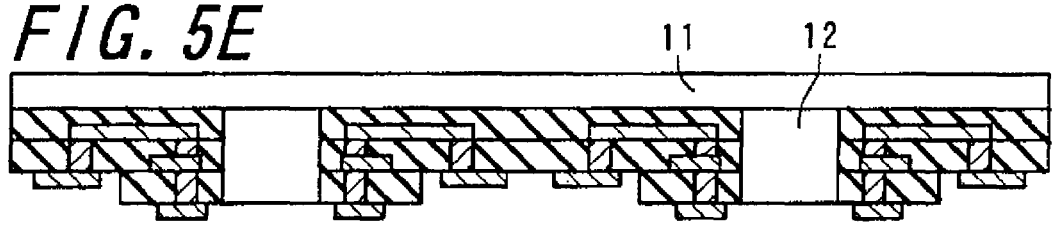
FIG. 5E is a view illustrating the other method of manufacturing the optical apparatus of FIG. 1.

Next, as shown in FIG. 5E, the glass substrate 11 and the green sheet laminate 43 are subjected to thermocompression bonding under the condition of a pressure of 3 to 10 MPa and a temperature of 50 to 80° C., and, thus, the glass substrate 11 and the green sheet laminate 43 are thermocompression bonded to each other.

Figure 5F:
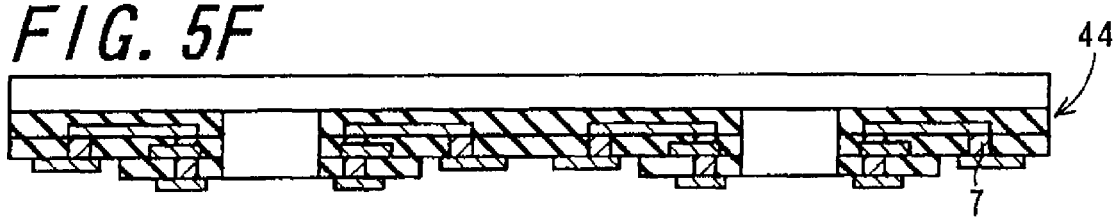
FIG. 5F is a view illustrating the other method of manufacturing the optical apparatus of FIG. 1.

Next, as shown in FIG. 5F, the green sheet laminate 43 that has been thermocompression bonded to the glass substrate 11 is fired, and, thus, a composite base substrate 44 is formed.

Figure 6A:
FIG. 6A is a view illustrating the other method of manufacturing the optical apparatus of FIG. 1.

Next, as shown in FIG. 6A, a semiconductor base substrate 45 is prepared. On the semiconductor base substrate 45, a plurality of optical MEMSs 2 are arranged in a matrix on a 4 to 8-inch silicon wafer using a micromachining technique.

Figure 6B:
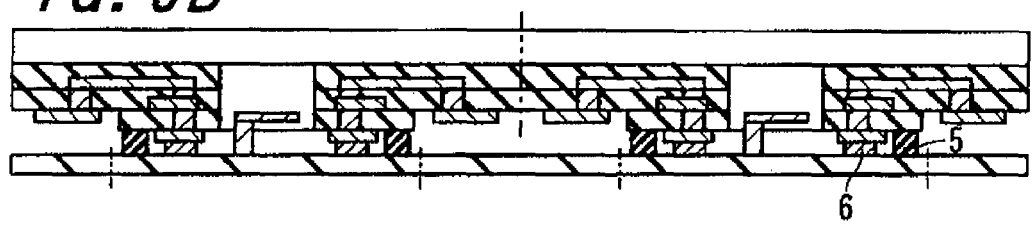
FIG. 6B is a view illustrating the other method of manufacturing the optical apparatus of FIG. 1.

Next, as shown in FIG. 6B, the composite base substrate 44 and the semiconductor base substrate 45 are connected to each other at the wafer level, and, thus, electric connection between the substrates 44 and 45 and hermetic sealing of the optical MEMS 2 are simultaneously obtained. The composite base substrate 44 and the semiconductor base substrate 45 are connected to each other at the wafer level at a temperature of 300 to 450° C., which is higher than the melting points of the sealing material forming the sealing member 5, and the conductive members 6, and under a pressure of several megapascals (MPa) to several tens of megapascals (MPa) in order to correct warping of the members.

Next, as shown in the broken line in FIG. 6B, the composite base substrate 44 and the semiconductor base substrate 45 are separated into pieces using dicing or the like, and, thus, a plurality of optical apparatuses 1 can be formed. Here, it is desirable that the surface of the wiring board 4 is stepped such that the distance H3 from the glass substrate 11 to the third area A3 that is to be connected to the external connection terminals 8 is shorter than the distance H2 from the glass substrate 11 to the second area A2 by 0.1 mm or more. Since the distance H3 is shorter than the distance H2 by 0.1 mm or more, damage on the third area A3 caused by a dicing blade can be suppressed in the separating step using dicing.

Figure 6C:
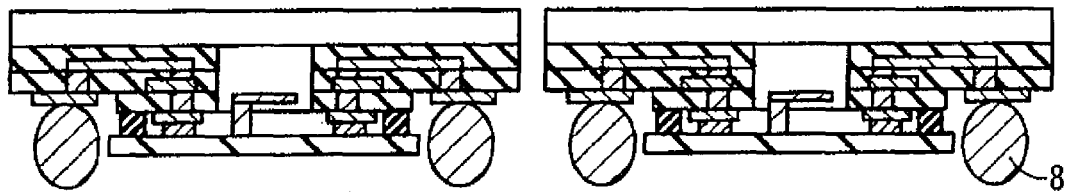
FIG. 6C is a view illustrating the other method of manufacturing the optical apparatus of FIG. 1.

Next, as shown in FIG. 6C, solder balls are attached as the external connection terminals 8 to peripheral portions of the surfaces of the wiring boards 4, using appropriate jigs and tools.

With the optical apparatus 1 according to this embodiment, the wiring board 4 functions as a cover that covers the optical MEMS 2. Accordingly, an optical apparatus that can transmit light to the optical MEMS 2 and that can realize electric connection having a high degree of freedom between the optical MEMS 2 and an external circuit can be more easily formed at the wafer level.

Examples of the optical MEMS 2 described above include a micromirror device that controls a reflection direction by tilting a micromirror using an electrostatic force, a grating light valve device that controls a diffraction direction using the movement of a small diffraction element, and the like.

Here, in the description above, an optical MEMS formed on a surface of a substrate using a micromachining technique is shown as an example of an optical element, but a separately formed optical element may be provided on the substrate.

Furthermore, in the case where the element substrate 3 can transmit a particular light that is transmitted through the light-transmitting substrate 11, the optical element 2 may be, for example, a light modulation element.

Furthermore, in the foregoing embodiments, the external connection terminals 8 are realized as solder balls, but there is no limitation to this. For example, the external connection terminals 8 may be realized through attachment of various pins.

The invention is not limited to the foregoing embodiments, and various modifications are possible within the scope of the gist of the invention.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

The invention claimed is:

1. An optical apparatus, comprising:
   an element substrate on whose surface an optical element is provided;
   a wiring board disposed so as to face the optical element;
   a sealing member provided between the element substrate and the wiring board, and surrounding and hermetically sealing the optical element; and
   a conductive member provided between the element substrate and the wiring board, and electrically connecting the optical element and the wiring board,
   wherein the wiring board comprises:
   a light-transmitting area transmitting light toward the optical element,
      a laminate laminated a plurality of insulating layers,
      a light-transmitting layer laminated on a surface of the laminate, the surface being opposite to another surface thereof facing the element substrate, and
      a wiring conductor provided inside the laminate, and
   the laminate comprises a through-hole in an area facing the optical element.

2. The optical apparatus according to claim 1, further comprising an external connection terminal on a surface of the wiring board, the sealing member being provided on the surface.

3. The optical apparatus according to claim 1, wherein the external connection terminal is provided around the sealing member on the surface on which the sealing member is provided.

4. The optical apparatus according to claim 1, wherein the laminate is a glass ceramic substrate containing a glass component, and the laminate and the light-transmitting layer are bonded to each other via the glass component.

5. A sealing substrate for hermetically sealing an optical element of an element substrate on whose surface the optical element is provided, comprising:
 a wiring board disposed so as to face the optical element;
 a sealing member provided on the wiring board, and surrounding and hermetically sealing the optical element between the element substrate and the wiring board; and
 a conductive member provided on the wiring board, and electrically connecting the optical element and the wiring board,
 wherein the wiring board comprises:
  a light-transmitting area transmitting light toward the optical element,
  a laminate laminated a plurality of insulating layers,
  a light-transmitting layer laminated on a surface of the laminate, the surface being opposite to another surface thereof facing the element substrate, and
  a wiring conductor provided inside the laminate, and
 the laminate comprises a through-hole in an area facing the optical element.

6. The sealing substrate according to claim 5, further comprising an external connection terminal on a surface of the wiring board, the sealing member and the conductive member being connected to the surface.

7. The sealing substrate according to claim 6, wherein the external connection terminal is provided around the sealing member on the surface to which the sealing member is connected.

8. The sealing substrate according to claim 5, wherein the laminate is a glass ceramic substrate containing a glass component, and the laminate and the light-transmitting layer are bonded to each other via the glass component.

9. A method of manufacturing an optical apparatus, comprising:
 preparing a plurality of glass-ceramic green sheets;
 forming a hole portion in the plurality of glass-ceramic green sheets;
 forming a conductor portion configured to be a wiring conductor after firing, in at least one of the plurality of glass-ceramic green sheets;
 laminating the plurality of glass-ceramic green sheets to form a green sheet laminate comprising a through-hole;
 laminating the green sheet laminate on a glass substrate, and subjecting the glass substrate and the green sheet laminate to thermocompression bonding;
 firing the green sheet laminate to form a composite substrate;
 preparing an element substrate on which an optical element is provided; and
 connecting the element substrate and the composite substrate in a state that the optical element and the through-hole of the composite substrate face each other.

* * * * *